United States Patent [19]

Sagou et al.

[11] Patent Number: 5,006,432

[45] Date of Patent: Apr. 9, 1991

[54] METHOD FOR MANUFACTURING A SHADOW MASK

[75] Inventors: Seiji Sagou; Yasuhisa Ohtake, both of Fukaya, Japan

[73] Assignee: Kabushiki Kaisha Toshiba, Kawasaki, Japan

[21] Appl. No.: 261,617

[22] Filed: Oct. 24, 1988

[30] Foreign Application Priority Data

Oct. 28, 1987 [JP] Japan ................................ 62-272118

[51] Int. Cl.[5] ................................................ G03F 7/16

[52] U.S. Cl. ...................................... 430/23; 430/935; 430/323; 427/209; 427/379; 156/644; 156/659.1

[58] Field of Search ...................... 430/23, 321, 5, 935, 430/320, 323; 445/47; 427/209, 379; 156/644, 659.1

[56] References Cited

U.S. PATENT DOCUMENTS

| | | | |
|---|---|---|---|
| 2,750,524 | 6/1956 | Braham | 430/5 X |
| 3,782,995 | 1/1974 | Takimoto et al. | 427/209 |
| 4,061,529 | 12/1977 | Goldman et al. | 156/644 |
| 4,210,843 | 7/1980 | Avadani | 313/403 |
| 4,565,755 | 1/1986 | Ohtake et al. | 430/5 |
| 4,755,257 | 7/1988 | Yamamoto et al. | 156/631 |
| 4,871,584 | 10/1989 | Weber | 427/96 |

FOREIGN PATENT DOCUMENTS

| | | | |
|---|---|---|---|
| 87-320 | 7/1981 | Japan | 427/209 |

*Primary Examiner*—Jose G. Dees

*Attorney, Agent, or Firm*—Cushman, Darby & Cushman

[57] ABSTRACT

A shadow mask is formed by forming two photosensitive resin layers respectively on both major surfaces of a band-like metal sheet. The first resin layer is formed by coating a resin solution on the first major surface with the first major surface directed upward, and drying the solution while maintaining the metal sheet horizontal. Likewise, the second resin layer is formed by coating a resin solution of the second major surface with the second major surface directed upward, and drying the solution while maintaining the metal sheet horizontal. Predetermined openings are made in the first and second resin layers by exposing and developing. Then, the bared portions of metal sheet are etched to form apertures therein.

7 Claims, 3 Drawing Sheets

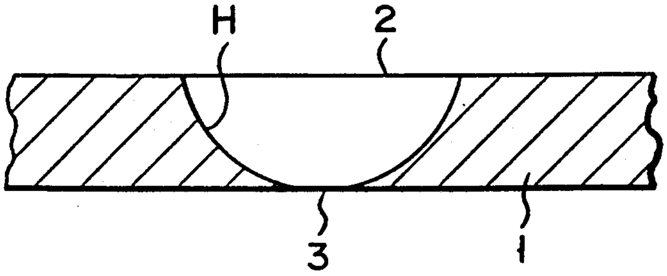
F I G. 1
F I G. 2A
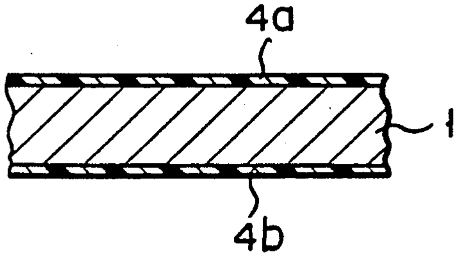
F I G. 2B
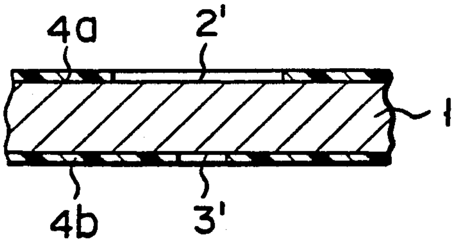
F I G. 2C
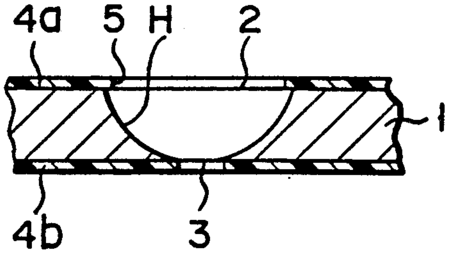

METHOD FOR MANUFACTURING A SHADOW MASK

BACKGROUND OF THE INVENTION

1. Field of the Invention

This invention relates to a method for manufacturing a shadow mask for use in a color CRT.

2. Description of the Related Art

Generally a shadow mask type color CRT includes a shadow mask having a great number of apertures formed at a predetermined pitch. The shadow mask is arranged closely opposite a fluorescent screen with R (red), B (blue) and G (green) phosphor layers coated in a stripe pattern. The phosphor layers emit red, green and blue fluorescent lights by irradiation of electron beams from three corresponding electron guns. The apertures of the shadow mask allow the three electron beams to selectively pass therethrough so that the beams land exactly on the R, B and G phosphor layers. It is thus possible to reproduce a color image. That is, the shadow mask constitutes one important member having a color selection function. A variation in the shape and dimension of the apertures, positional shift of the apertures to the corresponding phosphor layers and displacement of a shadow mask-to-phosphor screen distance away from a predetermined position, if exceeding their allowable range, present a grave problem in terms of the characteristic of the color CRT, such as a decline in color purity for the color CRT.

The respective aperture of the shadow mask is generally so configured as to allow a predetermined amount of electron beam which is generally slantwise incident toward the shadow mask to pass therethrough. That is, each aperture H of the shadow mask is formed in thin metal mask sheet 1 such that, as shown in FIG. 1, it has opening 2 on the side of the phosphor screen and opening 3 on the side of electron guns. In this case, opening 2 (larger opening) has a greater size than that of opening 3 (smaller opening).

This type of shadow mask is manufactured in the following steps.

As shown in FIG. 2A, photosensitive resin layers, such as photosensitive material-containing resist films 4*a* and 4*b* are formed on both major surfaces of bandlike metal thin sheet 1 which is used for a shadow mask material. The resist film is exposed to light via a photomask pattern corresponding to the size of an array of apertures. Then openings 2' and 3' corresponding to larger and smaller openings 2 and 3 are formed respectively in resist films 4*a* and 4*b* by development. Sheet 1 is then subjected to etching using an etching solution suitable for etching a particular material forming the sheet. If metal sheet 1 consists principally of iron, it can be etched by an etching solution containing ferric chloride as a main constituent, to provide an aperture H as shown in FIG. 2C. Remaining resist films 4*a*, 4*b* are removed from band-like thin metal sheet 1 to provide a flat mask. The flat mask is shaped to provide a complete shadow mask.

In order to provide a predetermined aperture configuration as shown in FIG. 1, etching has to be controlled first for the "smaller opening" side most relevant to the accuracy of its minimum diameter and then for the "larger opening" side. In the process of etching, a better efficiency of exchange between a fresh etching solution and a "fatigued" etching solution is involved at the location of larger opening 2 and, as a result, the etching rate and etching amount are greater on the "larger opening" side than on the "smaller opening" side.

However, the following problem arises in the control of the etching step.

At the etching of the "larger opening" side, side etching progresses due to the greater etching rate and greater etching amount being involved. At that side etching, overhang portion 5 is formed at resist film 4*a* such that it extends toward a center axis of larger opening 2 as shown in FIG. 2C. That overhang portion 5 is often separated or destroyed, for example, with a pressure under which the etching solution is sprayed.

As a result, further etching progresses at the destroyed portion of resist film 4, causing a variation in the configuration and dimension of apertures obtained. This variation prominently occurs at an array of reduced-diameter apertures of shadow mask at a shorter pitch as in a high-definition color CRT. The thicker the thin-metal sheet, the greater the amount of etching and the greater the time taken from etching to be conducted. Thus the side etching is liable to progress, causing a variation in the configuration and dimension of apertures as set forth above.

In the step of exposing the resist to light, the light which passes through the pattern mask is diffused in resist film 4 on thin metal sheet 1. At this time, light is passed through the pattern mask such that it exposes the resist film weakly at its thicker portion and strongly at its thinner portion. The resist film, if not uniform, involves a decline in dimensional accuracy of the openings involved. It is important that resist film 4 be formed, as a uniform thickness film, under a constant exposure condition.

As an ordinary resist coating method use is made of a flow coat method as shown in FIG. 3 and a dip coat method as shown in FIG. 4.

In the flow coat method as shown in FIG. 3, bandlike thin metal sheet 1 is vertically erected with one side edge thereof down and sequentially fed while being coated at each surface with a resist solution (resist material 6) in a down-flow fashion. The metal sheet enters drying furnace 7 where it is dried to obtain a resist film. The resist film obtained in thinner at the upper side portion than at the lower side portion and, that is, a film thickness difference occurs across the width of the band-like metal sheet due to a gravity action. A uniform film thickness cannot be obtained even if, in order to cancel such a film thickness difference, use is made of a drying furnace having such a temperature distribution as to allow, for example, the upper portion of the metal sheet to be dried at a faster rate than the lower portion thereof or even if the conveying speed of the thin metal sheet, viscosity of a resist film, and so on vary in various conditions.

In the dip coat method as shown in FIG. 4, bandlike thin metal sheet 1, while being conveyed in the longitudinal direction, is dipped into resist tank 8 holding resist solution 6, and passes, while being lifted off in a vertical direction, through drying furnace 9 where it is dried. The resist film thus obtained involves a film thickness difference in the longitudinal direction due to the coated resist solution flowed by gravity down along each surface until it is fixed to the each surface of the film. It is not possible to obtain a uniform thickness resist film even if conditions such as the viscosity of the resist solution, lift-off speed of the metal film, drying temperature distribution in the drying furnace, and amount of air blown into the drying furnace are varied so as to eliminate a film thickness difference.

As evident from the above, the coated metal sheet is unavoidably adversely affected by the gravity, failing to obtain a uniform thickness resist film.

If thin metal sheet 1 is thickened, side etching is liable to progress due to a longer etching time involved so that the aforementioned resist film is separated or destroyed at its overhang portion 5. To combat this problem, the resist film is thickened to improve the mechanical strength of resist film 4. If, in the conventional method, the resist film is re-set to a greater thickness, however, it is necessary to largely vary the viscosity of the resist as well as the coating and drying conditions. Even if these steps are done in the aforementioned method, it is not possible to obtain a uniform resist film due to a gravity involved. It is thus not possible to simply obtain resist films of a uniform thickness on a quantity production line.

A better resolution of resist film 4 is desired so as to obtain apertures of better dimensional accuracy in the resist film. The resolution depends upon the characteristic of the resist material and thickness of the resist film. The thinner the resist film, the higher the resolution. In the etching step, unless overhang portion 5 is separated or destroyed, the resist film on the side of smaller opening 3, which determines the dimension of apertures in the shadow mask in particular, is better be made as thin as possible in comparison with that on the side of larger aperture 2. Japanese Patent Disclosure (KOKAI) No. 60-70185 proposes, for example, a two-stage etching method whereby, even if the resist film is made thinner, no overhang portion is broken at the location of the apertures due to the etching time shorter on the side of the smaller openings. The use of this method enables the resist film to be made thinner without degrading the quality of the shadow mask.

Thus various means have been proposed to manufacture a high-definition shadow mask, but it has been very difficult to uniformly coat a resist film which is responsible for the dimensional accuracy of the apertures obtained.

SUMMARY OF THE INVENTION

It is accordingly the object of this invention to provide a method for manufacturing a shadow mask which can freely vary the thickness of a layer on each major surface of a band-like thin metal sheet and can form the layer on each major surface of the band-like thin metal sheet such that it has a uniform thickness across the width and length of the band-like thin metal sheet.

This invention provides a method for manufacturing a shadow mask which is constituted by a thin metal sheet having an array of apertures to allow three electron beams to be landed to corresponding phosphor layers on a CRT phosphor screen. The shadow mask is manufactured in the following way.

A band-like thin metal sheet is prepared which has first and second major surfaces. A photosensitive resin solution is coated on the first major surface of the thin metal sheet and the coated thin metal sheet, while being maintained in a substantially horizontal position, is dried with the coated surface up to provide a first photosensitive resin layer. Then the resultant metal sheet is turned with its second major surface up and has its second major surface coated with a photosensitive resin solution. The coated second surface of the metal sheet, while being maintained in a substantially horizontal position, is dried to form a second photosensitive resin layer. An opened pattern corresponding to an array of apertures in the shadow mask is formed by subjecting the first and second photosensitive resin layers to an exposure and development. The band-like thin metal sheet is etched to provide the apertures therein. The resultant band-like thin metal sheet is cut to a desired size and shaped to obtain a shadow mask.

The aforementioned band-like thin metal sheet can be sequentially conveyed in a horizontally oriented fashion at the coating and drying steps for forming the first and second photosensitive resin layers.

It is preferred that at the aforementioned drying steps the photosensitive resin layer on the first major surface of the metal sheet be heat-dried within a first drying furnace and then the photosensitive resin layer on only the second major surface of the thin metal sheet be heat-dried within a second drying furnace. This is because if the photosensitive resin layer, once formed on the first major surface, is reheated at high temperatures within the second drying furnace then "thermal dark reaction" is liable to occur so that there occurs a decline in the photosensitive characteristics.

In the conventional method, if the thickness of the photosensitive resin layer is varied, various conditions of the coating device have to be satisfied on the rule-of thumb, while paying consideration to the dripping and drying speeds of the photosensitive resin solution. According to the present invention, a desired layer thickness can readily be obtained simply by determining a distance between a coater, such as a pipe doctor, and the thin metal sheet surface.

In the conventional method, in order to enhance the efficiency per unit time with which the photosensitive resin layer is formed on the thin metal sheet, a method is used which, for example, raises the conveying speed of the thin metal sheet and provides a long drying furnace substantially corresponding to the conveying speed. According to this invention it is possible to raise the efficiency of the photosensitive resin layer formation at a shorter drying time by increasing a ratio of a solids content to an amount of solvent of a resist material and hence decreasing a relative ratio of the solvent to the same amount of solids with a narrow distance defined between a pipe doctor and the thin metal sheet surface.

BRIEF DESCRIPTION OF THE DRAWINGS

FIG. 1 is a cross-sectional view showing one form of a aperture in a shadow mask;

FIGS. 2A to 2C are a cross-sectional view showing the steps of manufacturing a shadow mask;

DETAILED DESCRIPTION OF THE PREFERRED EMBODIMENTS

The present invention will be explained in greater detail below with reference to the accompanying drawings.

Figure 3:
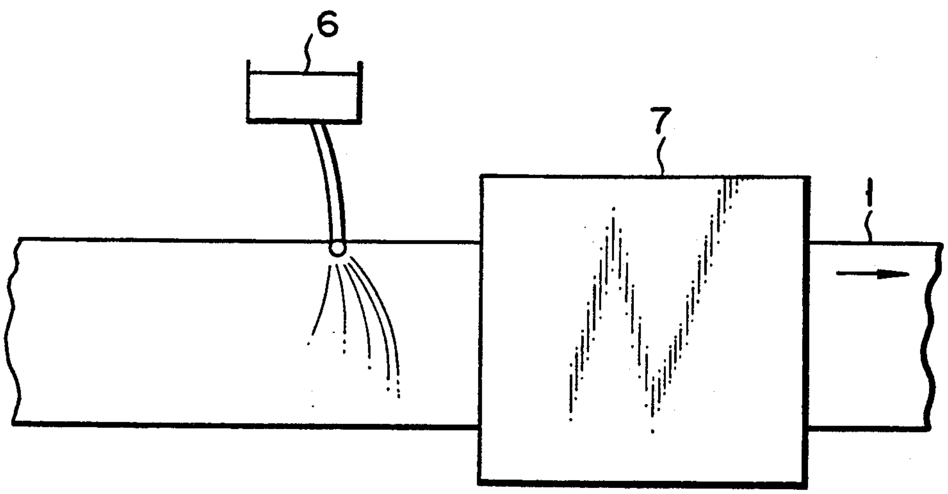
F I G. 3 PRIOR ART
FIGS. 3 and 4 are views showing conventional photosensitive resin coating devices for use in methods which manufacture a shadow mask.
Figure 4:
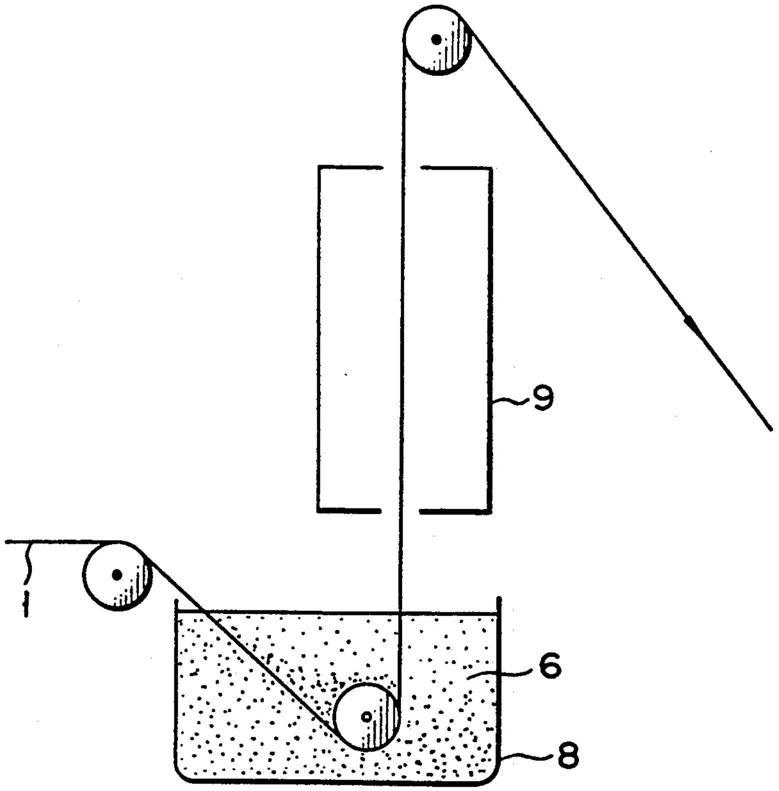
F I G. 4 PRIOR ART
Figure 5:
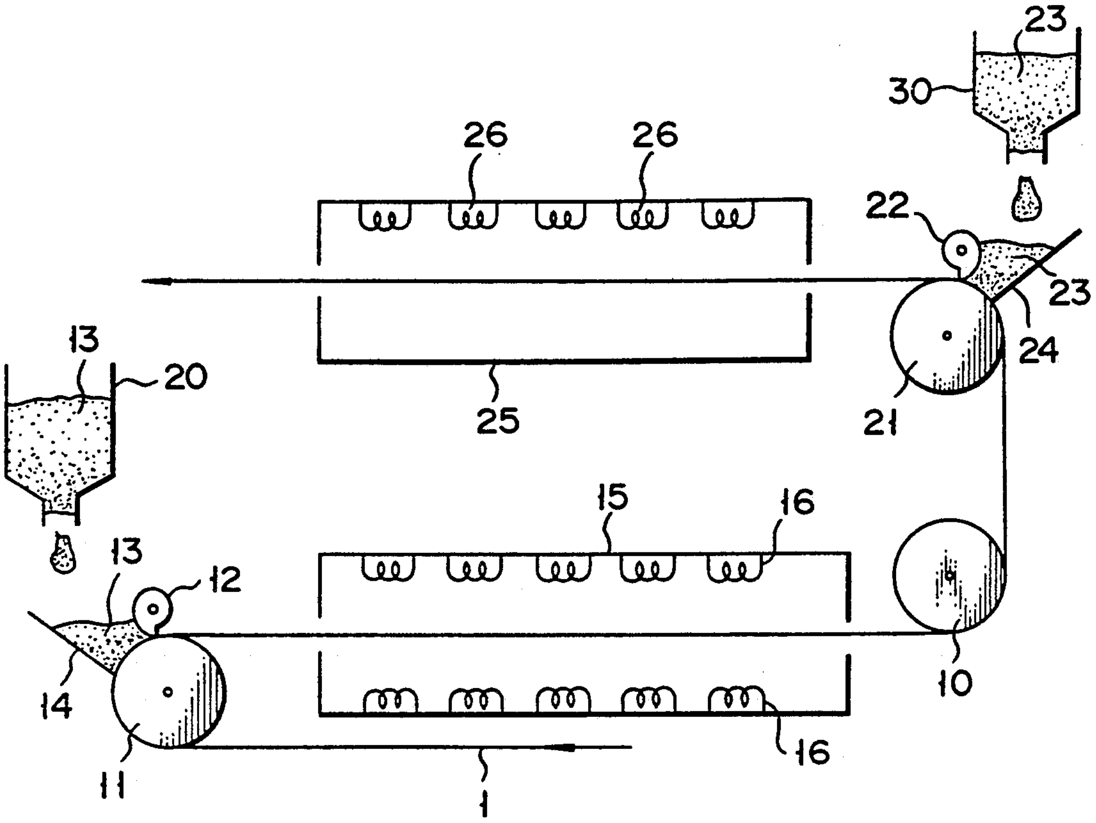
FIG. 5 is a diagrammatic view showing one coating device for coating a photosensitive resin solution on each major surface of a thin metal sheet for a shadow mask of this invention.

FIG. 5 shows a coating device for use in a method for manufacturing a shadow mask of this invention. The device includes back-up roller 11 for conveying band-like thin metal sheet 1 in a longitudinal direction and dam 14 provided relative to back-up roller 11. The dam 14 stores a photosensitive resin solution, for example, resist solution 13 containing a photosensitive agent, which is supplied to an upper surface, that is, a first major surface of thin metal sheet 1. A coater, such as pipe doctor 12, is provided over roller 11 to apply a predetermined thickness of resist material 13 to thin metal sheet 1.

The coating device includes a first drying furnace 15 downstream of roller 11 to allow the resist material to be dried. Turn roller 10 is provided downstream of the first drying furnace 15. Back-up roller 21 is provided over turn roller 10 to allow thin metal sheet 1 which is upwardly lifted off by means of turn roller 10 to be turned with a second major surface up. Dam 24 and pipe doctor 22 similar to dam 14 and pipe doctor 12, respectively, are provided at back-up roller 21. A second drying furnace 25 is provided downstream of roller 21.

In the manufacture of the shadow mask on the coating device, band-like thin metal sheet 1, such as iron, is prepared as a material for the shadow mask. The thin metal sheet is fed into a degreasing chamber (not shown) where it is heat-treated at 80° C. with an alkali solution to eliminate any rolling oil and rust preventive oil. Then the thin metal sheet enters a washing chamber where it is washed, for example, with water to clean each major surface of the thin metal sheet.

As shown in FIG. 5, cleaned thin metal sheet 1 is first longitudinally conveyed to back-up roller 11 where it is turned there around to allow resist material 13 which is supplied to dam 14 to be applied to the first major surface, that is, the turned upper surface of thin metal sheet 1. Resist material 13 is supplied under its own weight from resist supply tank 20 which is provided over dam 14 onto that surface of the metal sheet.

As resist material 13, any conventional types materials may be used which are currently in use. The photosensitive resin solution has a viscosity of preferably 10 to 1000 cps and more preferably 12 to 200 cps. For less than 10 cps, the photosensitive resin solution coated on the major surface of the thin metal sheet is not stable at its surface and, during a drying step, it is liable to be influenced by a slight oscillation and hence a coated surface provides an irregular pattern. In addition, it is difficult to thicken the photosensitive resin film due to less solids content and it takes longer to perform a drying step due to more solvent content. If, on the other hand, the viscosity of the photosensitive resin solution exceeds 1000 cps, no uniform shearing force is applied thereto when the photosensitive resin solution passes between the coater and the thin metal sheet at that gap. Thus an irregular surface is liable to be formed on the thin metal sheet. It is difficult to make a fine film thickness control because of the high solids content. As one example of the resist material, a photosensitive resin solution can be used which is adjusted to a viscosity of about 100 cps and prepared from milk casein added with about 1% by weight of ammonium bichromate.

An excess amount of resist material, such as one scattered at the coating step of resist material, is collected at a resist material pan, not shown, which is provided below dam 14. The collected resist material can be pumped by a pump via a resist material reservoir tank (not shown) back to resist material supply tank 20 for recycle.

Thin metal sheet 1 is horizontally conveyed along a path between back-up roller 11 and turn roller 10. During the horizontal conveyance the resist material which is applied to the first major surface of sheet 1 is moved past pipe doctor 12 to allow a uniform layer to be coated on the thin metal sheet.

The thickness of resist material 13 which is coated on the surface of the thin metal sheet can be varied by properly selecting a distance between pipe doctor 12 and thin metal sheet 1. Thus pipe doctor 12 can be moved up and down to allow its distance to thin metal sheet 1 to be freely varied.

The coated thin metal sheet, while being horizontally conveyed in the longitudinal direction, enters drying furnace 15 to allow it to be heat-dried in the vertically "up" and "down" directions by, for example, far infrared rays heaters 16 which are provided at the top and bottom of drying furnace 15.

The thin metal sheet so formed as to have a predetermined resist film thickness on the first major surface thereof is lifted off around turn roller 10 to back-up roller 21 where the thin metal sheet is turned with the second major surface up. As in the case where the resist is applied to the first major surface of the thin metal sheet, the turned thin metal sheet, while being horizontally conveyed in the longitudinal direction, has its second major surface supplied by dam 24 with similar resist material 23 to resist material 13 supplied from resist material supply tank 30. The thin metal sheet is conveyed past pipe doctor 22 to allow a predetermined uniform resist film to be formed on the second major surface of the thin metal sheet. An excessive amount of resist material is also collected for recycle.

The thin metal sheet with the second major surface coated with the resist, while being horizontally conveyed, enters the second drying furnace 25 where it is heated by, for example, far infrared rays heaters 26 which are provided at the top portion, not at the bottom portion, of the drying furnace. That is, the coated thin metal sheet, while being thus conveyed, is dried in a direction from the top toward the bottom of the drying furnace, If, at this time, the resist material is the aforementioned one comprising milk casein and ammonium bichromate, then the resist material is so controlled that it is not heated at a temperature of over 90° C. This is because if the resist film, once formed on the first major surface of the thin metal sheet, is heated at a temperature of over 90° "thermal dark reaction" is liable to occur. As a drying heat source for drying furnaces 15 and 25, sheathed wire heaters, warm air or a combination thereof can be employed instead of far infrared rays heaters.

When with the doctor (12, 22)-to-sheet (1) distance set at 100 μm the resist film was coated on the surface of the metal sheet, then 7.0 μm-thick resist film was obtained on the metal sheet whose surface is uniform.

Since the thickness of the resist coated on each major surface of the thin metal sheet can be independently controlled, it is possible to form resist films of an identical or a different thickness on the surfaces. For example, with a doctor (12)-to-sheet (1) and doctor (22)-to-sheet (1) distances set to about 80 μm and about 120 μm, respectively, resist materials 13 and 23 were coated on the respective major surfaces of the thin metal sheet to obtain uniformly coated layers, that is, a 5.6 μm-thick layer on the first major surface and an 8.4 μm-thick layer on the second major surface. As will be appreciated from the above, without varying the conditions, such as the conveying speeds and viscosity of the resist material, a resist layer of a different thickness can be formed simply by varying the distance between the metal sheet and the pipe doctor.

The resist material can be coated not only with the use of the pipe doctor but also by a knife coating method and reverse coat method.

Shadow masks can be made by a conventional processing from the thin metal sheet having its both major surfaces coated with the resist layers as described above. For example, using a 300 m-length thin metal sheet on which resist layers of, for example, 7.0 μm are formed by the aforementioned method, shadow masks can be manufactured as follows.

The resist coated thin metal sheet is exposed for about 1 minute by a 5 KW ultra-high voltage mercury lamp from a distance of about 1 m apart with the use of a predetermined printed pattern. The resultant sheet is developed by a spraying method under a pressure of 1.0 $kg/cm^2$ for 1 minute with the use of warm water of about 40° C. The resultant structure is dried under an atmosphere of about 150° C. for about 2 minutes and then burned under an atmosphere of about 200° C. for about 1.5 minutes.

As a result, openings for forming apertures H as shown in FIG. 1 are formed in the resist layers, exposing surface portions of the metal sheet 1.

An etching solution, such as ferric chloride, adjusted to a temperature of 67° C. and density of 1.467 is jetted onto the resist film from a nozzle which is located in a position 300 mm from the resist film. The etched thin metal layer is washed with water and 1.5% NaOH aqueous solution of 90° C. is sprayed onto the resist film under a pressure of 1 $kg/cm^2$ for about 3 minutes to remove a remaining resist film. The obtained thin metal sheet is washed and dried to obtain a flat mask constituted by a band-like thin metal sheet with an array of apertures therein. A shadow mask can be obtained by cutting the flat mask to a desired size followed by shaping.

The shadow mask thus obtained is high in dimensional accuracy of apertures and excellent in quality.

According to this invention, it is possible to, at the step of forming a photosensitive resin layer, freely vary the thickness of the photosensitive resin film on each major surface of the thin metal sheet and to form a photosensitive resin film of uniform thickness across the width and length of the thin metal sheet. As a result, a shadow mask thus manufactured is excellent in dimensional accuracy of the apertures.

According to this invention, at the process of forming a photosensitive resin film having a desired thickness on each major surface of the thin metal sheet, the coating thickness required of the photosensitive resin solution is evaluated from the solids content in the photosensitive resin solution and it is only necessary according to this invention to provide a corresponding spacing or distance between the coater, such as the pipe doctor and the surface of the thin metal sheet. In other words, any desired photosensitive resin film can be obtained by varying that distance and, given a predetermined distance there-between, the thickness of the photosensitive resin film is constant even if the thin metal sheet is conveyed at a varying speed. Since the photosensitive resin solution is coated on the upper surface of the substantially horizontally conveying thin metal sheet, it never flows down nor drips along the metal sheet as encountered in the conventional method and, at the drying step, the photosensitive resin solution on the thin metal sheet surface is fixed there and dries up in the horizontal position. As a result, no ununiform photosensitive resin layer occurs on and across the width and length of the thin metal sheet which has been encountered due to the down-flow or dripping of the photosensitive resin solution under a gravity.

Figure 6:
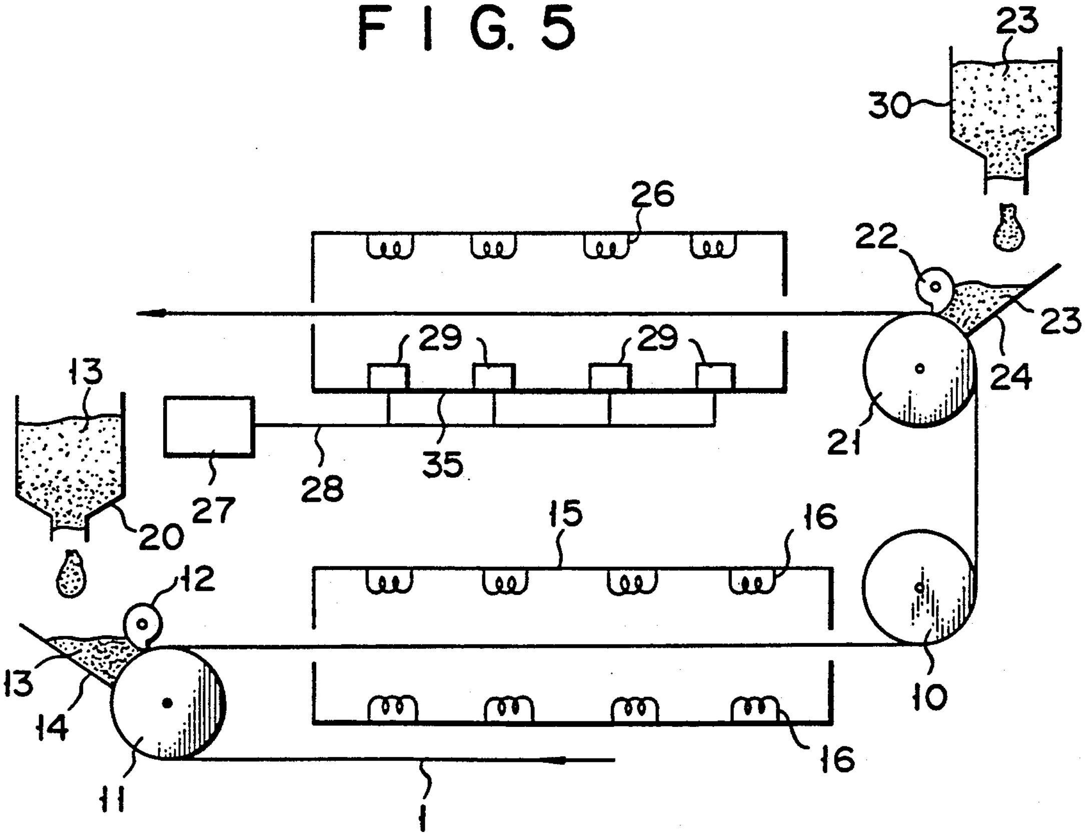
FIG. 6 is a diagrammatic view showing another coating device for coating a photosensitive resin solution on each major surface of a thin metal sheet for a shadow mask of this invention.

FIG. 6 shows another coating device which is used to carry out the present invention. This device is the same as that of FIG. 5 except for the specific arrangement of drying furnace 35 and identical reference numerals are employed in FIG. 6 to designate identical parts or elements corresponding to those shown in FIG. 5. As will be appreciated from FIG. 6, drying furnace 35 has air inlets 29 at the bottom thereof which are connected to air fan 27 via air supply pipe 28. A resist film can be formed by the device of FIG. 6 on each major surface of the thin metal sheet in the same way as that explained in conjunction with FIG. 5. In the arrangement shown in FIG. 6, upon the entry of drying furnace 35 the coated but not dried second major surface of the resist layer is dried by far infrared rays heaters 26 in a direction from the top toward the bottom of the drying furnace while, on the other hand, cool air is sent from air fan 27 via air supply pipe 28 and air inlets 29 into the drying furnace from below, causing the resist film which has been formed on the first major surface to be cooled. Thus, using the device of FIG. 6, an advantage that "thermal dark reaction" is more effectively prevented from occurring on the resist film on the first major surface of the thin metal sheet can be obtained, in addition to the advantages obtained using the device of FIG. 1.

What is claimed is:

1. A method for manufacturing a shadow mask composed of a thin metal mask sheet having a plurality of apertures to allow three electron beams to be landed on corresponding phosphor layers on a phosphor screen, comprising the steps of:

(a) providing a band-like continuous thin metal sheet having first and second major surfaces;

(b) forming a first photosensitive resin layer on said first major surface by coating a first photosensitive resin solution on said fist major surface with said first major surface directed upward, and drying the coated first resin solution, said coating and drying being carried out while maintaining the metal sheet substantially horizontal;

(c) turning the coated, dried metal sheet so as to direct said second major surface upward;

(d) forming a second photosensitive resin layer on said second major surface by coating a second photosensitive resin solution on said second major surface with said second major surface directed upward, and drying the coated second resin solution, said coating and drying being carried out while maintaining the metal sheet substantially horizontal;

(e) forming opening patterns, corresponding to said apertures, in said first and second resin layers by subjecting the layers to an exposure and development process; and (f) forming said apertures in said metal sheet by subjecting the metal sheet with said resin layer having the openings to an etching treatment.

2. The method according to claim 1, wherein a pipe doctor is used to coat said band-like thin metal sheet with said photosensitive resin solution.

3. The method according to claim 1, wherein a reverse coater is used to coat said band-like thin metal sheet with said photosensitive resin solution.

4. The method according to claim 1, wherein said first resin solution is dried by applying heat to both said first and second major surface in a first furnace, and said second resin solution is dried by applying heat only to said second major surface in a second furnace.

5. The method according to claim 1, wherein said first and second photosensitive resin layers are so formed as to have a different thickness.

6. The method according to claim 1, wherein said metal sheet having said first resin layer is carried in a longitudinal direction, lifted upward using a turn roller, and turned using a back-up roller thereby directing said first major surface downward.

7. The method according to claim 1, wherein said second resin solution is thermally dried, while cooling said first resin layer by applying cooling air thereto.

* * * * *